(12) United States Patent  
Chindo

(10) Patent No.: US 7,911,611 B2  
(45) Date of Patent: Mar. 22, 2011

(54) OPTICAL SYSTEM OF ATOMIC OSCILLATOR AND ATOMIC OSCILLATOR

(75) Inventor: Koji Chindo, Kawasaki (JP)

(73) Assignee: Epson Toyocom Corporation (JP)

( * ) Notice: Subject to any disclaimer, the term of this patent is extended or adjusted under 35 U.S.C. 154(b) by 100 days.

(21) Appl. No.: 12/489,646

(22) Filed: Jun. 23, 2009

(65) Prior Publication Data

US 2010/0002231 A1 Jan. 7, 2010

(30) Foreign Application Priority Data

Jul. 3, 2008 (JP) ................. 2008-174254  
Apr. 6, 2009 (JP) ................. 2009-091828  
May 27, 2009 (JP) ................. 2009-127577

(51) Int. Cl.  
*G01J 4/00* (2006.01)  
*H01S 1/06* (2006.01)  
*H03B 17/00* (2006.01)

(52) U.S. Cl. ................. 356/370; 331/3; 331/94.1

(58) Field of Classification Search .......... 356/370; 331/3, 94.1  
See application file for complete search history.

(56) References Cited

U.S. PATENT DOCUMENTS

| | | | | |
|---|---|---|---|---|
| 5,036,278 A * | 7/1991 | Slocum | ........................ | 324/304 |
| 6,201,821 B1 * | 3/2001 | Zhu et al. | ........................ | 372/32 |
| 6,222,424 B1 * | 4/2001 | Janssen et al. | ................ | 331/94.1 |
| 6,265,945 B1 * | 7/2001 | Delaney et al. | ................. | 331/3 |
| 6,993,058 B2 * | 1/2006 | Zhu | ............................. | 372/106 |

* cited by examiner

*Primary Examiner* — Roy Punnoose  
(74) *Attorney, Agent, or Firm* — Harness, Dickey & Pierce, P.L.C.

(57) ABSTRACT

An optical system of an atomic oscillator that regulates an oscillation frequency by using an optical absorption property by one of a double resonance method utilizing light and micro waves and a coherent population trapping (CPT) method utilizing a quantum interference effect produced by two kinds of resonance light, includes: a light source emitting the resonance light; a gas cell disposed at an emitting side of the light source, sealing a gaseous metal atom therein and transmitting the resonance light through a metal atom gas; a light detecting unit detecting the transmitted light that is transmitted through the metal atom gas; and a fluorescence blocking unit blocking at least a part of fluorescence, which is emitted from the metal atom gas to the light detecting unit, and disposed between the metal atom gas and the light detecting unit.

9 Claims, 4 Drawing Sheets

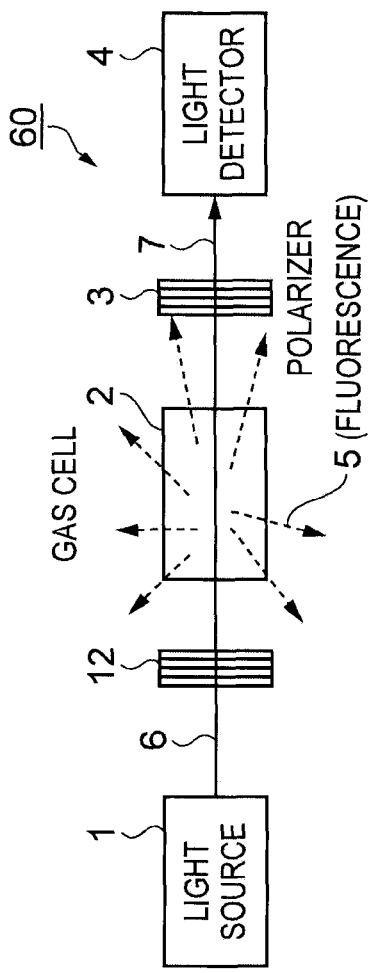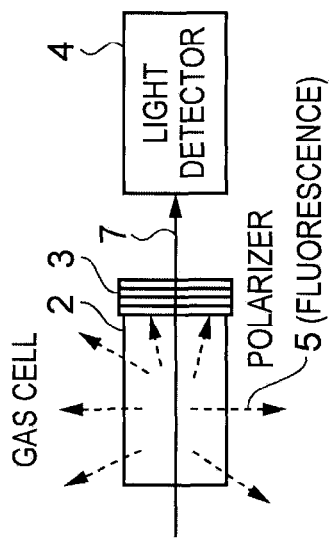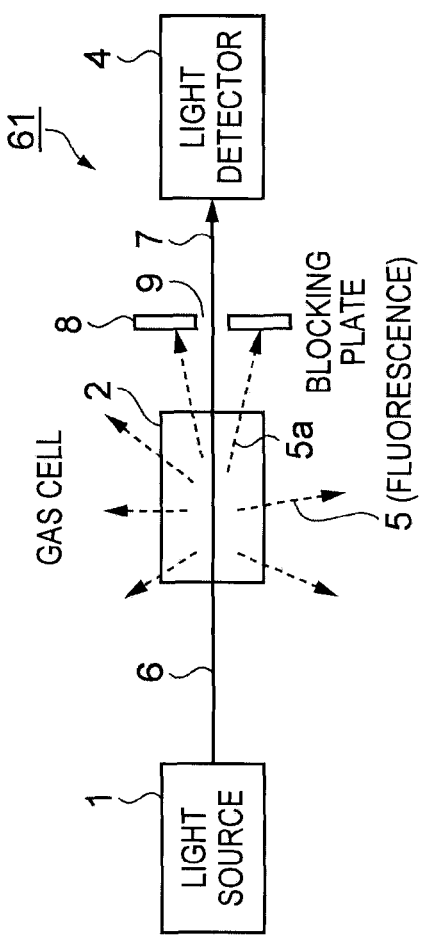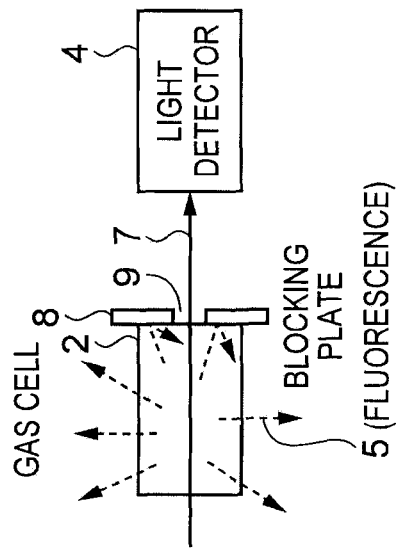

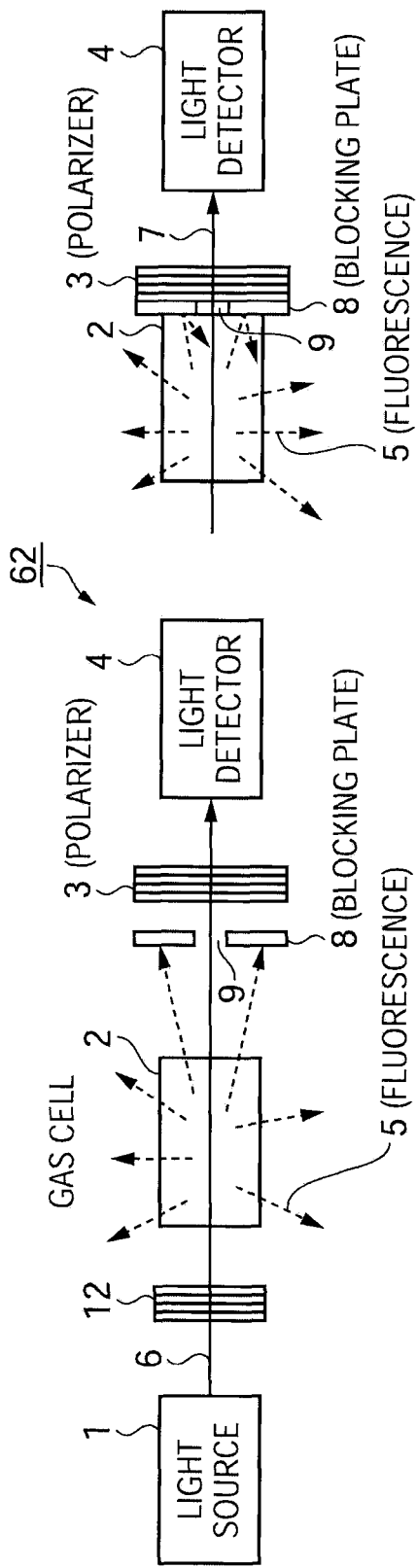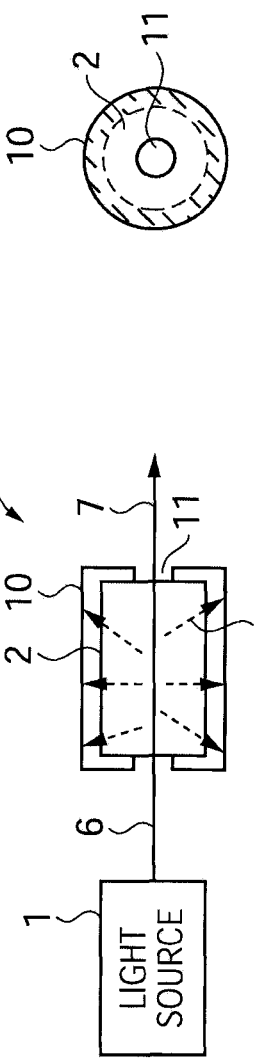

OPTICAL SYSTEM OF ATOMIC OSCILLATOR AND ATOMIC OSCILLATOR

BACKGROUND

1. Technical Field

The present invention relates to an optical system of an atomic oscillator, in particular, relates to a structural technique by which an S/N ratio of transmitted light emitted from a gas cell included in the atomic oscillator is improved.

2. Related Art

Atomic oscillators using alkali metals such as rubidium and cesium operate while maintaining a gas cell, in which atoms are air-tightly sealed, at a high temperature because the atoms need to be kept in a gas state when the oscillators use energy transition of the atoms. An operating principle of the atomic oscillators is broadly classified into a double resonance method utilizing light and micro waves and a method utilizing quantum interference effect produced by two kinds of laser light (hereinafter, referred to as coherent population trapping: CPT). In both of the methods, atomic resonance is detected by detecting how much light made incident on the gas cell is absorbed by atom gas with a detector, so as to allow a reference signal of a quartz crystal oscillator and the like to synchronize with the atomic resonance by a control system, obtaining an output. The detector is disposed at an opposite side to a side, to which the light is made incident, of the gas cell. However, in the CPT method, when resonance light has a wavelength at which the light is absorbed by the gas cell, metal atoms in the gas cell emit fluorescence due to the light absorbed by the gas cell. The fluorescence is incident on the light detector as leaked light, so that a level of primary transmitted light is increased, resulting in degradation of an S/N ratio of a detecting signal.

U.S. Pat. No. 6,265,945 B1, for example, discloses an atomic oscillator employing the CPT method by which part of light of a light source split by a beam splitter is detected so as to stabilize power of the light source.

Referring to FIG. 6, in a structure of a related art optical system disclosed in the above example, laser light emitted from a vcsel 50 is split by a beam splitter 53. One beam of the laser light is detected at an optical pwr. detector 52, and the other beam of the laser light is transmitted through a cell 55 and is detected at a transmission detector 56. Fluorescence is emitted from the cell 55 and a signal complementary with a signal detected by the transmission detector 56 is detected by a fluorescence detector 54. However, the related art has no blocking unit blocking emitted fluorescence. Thus the related art has not solved the problem of the degradation of an S/N ratio of the transmitted light.

SUMMARY

An advantage of the present invention is to provide an optical system of an atomic oscillator, in which a fluorescence blocking unit is provided at an emitting side of a gas cell so as to prevent fluorescence as leaked light from entering a light detector and thus improve an S/N ratio of transmitted light.

The invention can be achieved by following aspects.

An optical system, according to a first aspect of the invention, of an atomic oscillator that regulates an oscillation frequency by using an optical absorption property by one of a double resonance method utilizing light and micro waves and a coherent population trapping (CPT) method utilizing a quantum interference effect produced by two kinds of resonance light, includes: a light source emitting the resonance light; a gas cell disposed at an emitting side of the light source, sealing a gaseous metal atom therein and transmitting the resonance light through a metal atom gas; a light detecting unit detecting the transmitted light that is transmitted through the metal atom gas; and a fluorescence blocking unit blocking at least a part of fluorescence, which is emitted from the metal atom gas to the light detecting unit, and disposed between the metal atom gas and the light detecting unit.

When the resonance light has a wavelength at which the light is absorbed by the gas cell, the metal atom in the gas cell emits the fluorescence due to the light absorbed by the gas cell. The fluorescence is incident on the light detecting unit as leaked light, so that a level of primary transmitted light is increased, resulting in degradation of an S/N ratio of a detecting signal. Therefore, in the first aspect, the fluorescence blocking unit blocking the fluorescence emitted from the gas cell is disposed at the emitting side of the gas cell. Accordingly, the S/N ratio of a signal for detecting the transmitted light can be improved.

In the optical system of the first aspect, the fluorescence blocking unit may be composed of a polarizing unit that selectively transmits the transmitted light.

The resonance light emitted from the light source is transmitted through a polarizing unit so as to be polarized in a predetermined direction, and is incident on the gas cell. Therefore, when the fluorescence blocking unit is composed of a polarizing unit having the same polarizing direction as that of the transmitted light, only the transmitted light is transmitted through and the fluorescence can be prevented from being transmitted through the polarizing unit. Thus, the transmitted light is selectively transmitted.

In the optical system of the first aspect, the fluorescence blocking unit may be composed of a blocking plate having an opening through which the transmitted light is able to pass.

The fluorescence emitted from the gas cell diffuses all around at random. Especially, fluorescence diffusing from the emitting surface of the gas cell is highly likely incident on the light detecting unit. Therefore, in the first aspect, the optical system has a structure in which the blocking plate having an opening which is necessary for the transmitted light to pass therethrough is provided, and thus the fluorescence other than the transmitted light is blocked. Thus, only the transmitted light is transmitted through while blocking the fluorescence as leaked light by a simple structure.

In the optical system of the first aspect, the fluorescence blocking unit may be composed of the polarizing unit and the blocking plate.

Even though the fluorescence is polarized by the polarizing unit, a slight amount of the fluorescence may not be blocked by the polarizing unit. Therefore, the polarizing unit and the blocking plate are disposed in series so as to form the fluorescence blocking unit. Accordingly, the leaked light of the fluorescence can be more effectively blocked.

In the optical system of the first aspect, the fluorescence blocking unit may be closely attached to the gas cell.

As the distance from the gas cell to the light detecting unit is increased, surrounding leaked light is more highly likely incident on the light detecting unit. Therefore, in the first aspect, the fluorescence blocking unit is closely attached to the gas cell. Accordingly, provability that the surrounding leaked light enters the light detecting unit can be lowered and the optical system can be miniaturized.

In the optical system of the first aspect, a fluorescence absorbing member absorbing the fluorescence may be formed at a circumference of the gas cell.

The circumference of the gas cell is made of transparent glass, so that the fluorescence may be emitted from all surfaces of the gas cell. In addition, if there is a reflection member at the periphery of the gas cell, the fluorescence may be reflected so as to be disadvantageously incident on the light detecting unit as wandering light. Therefore, in the first aspect, the fluorescence absorbing member is provided on the circumference of the gas cell. Accordingly, the fluorescence emitted from the gas cell can be prevented from entering the light detecting unit as wandering light.

In the optical system of the first aspect, the polarizing unit may be composed of one of a polarizing filter and a beam splitter.

The polarizing filter serves as a filter by which light in a certain vibrating direction is taken out, and the beam splitter reflects a part of incident light and transmits other part of the light therethrough. Alternatively, a polarizing beam splitter that is capable of separating polarization components may be used. Thereby, the transmitted light and the fluorescence can be securely separated from each other with a simple structure.

In the optical system of the first aspect, the gas cell may be made of polarizing glass and the polarizing glass may serve also as the fluorescence blocking unit.

Thus the gas cell is made of polarizing glass. Therefore, the number of components (fluorescence blocking unit) for a fluorescence blocking function of the gas cell (polarizing glass) can be reduced.

An atomic oscillator according to a second aspect includes the optical system of the first aspect.

An intensity of fluorescence is detected and fed back to a coherent light source, and thus overall variation of light emitted from the coherent light source is detected in real time, being able to stabilize light intensity of the coherent light source. Thus, a high-performance atomic oscillator of which an S/N ratio is improved can be provided.

BRIEF DESCRIPTION OF THE DRAWINGS

The invention will be described with reference to the accompanying drawings, wherein like numbers reference like elements.

FIG. 2A is a diagram schematically showing a structure of an optical system of a first embodiment of the invention, and FIG. 2B is a diagram showing a structure in which a polarizer is closely attached to a gas cell.

FIG. 3A is a diagram schematically showing a structure of an optical system of a second embodiment of the invention, and FIG. 3B is a diagram showing a structure in which a blocking plate is closely attached to a gas cell.

FIG. 4A is a diagram schematically showing a structure of an optical system of a third embodiment of the invention, and FIG. 4B is a diagram showing a structure in which a blocking plate and a polarizer are closely attached to a gas cell.

FIG. 5A is a diagram for explaining a method for preventing diffusion of fluorescence emitted from a gas cell used in the optical system of the invention. FIG. 5B is a diagram showing the gas cell viewed from an emitting side.

DESCRIPTION OF EXEMPLARY EMBODIMENTS

Embodiments of the present invention will be circumstantially described below with reference to the accompanying drawings. Note that elements, kinds, combinations, shapes, relative positions, and the like described in the embodiments do not limit the range of this invention, but are only examples unless the description gives a specific statement.

Figure 1:
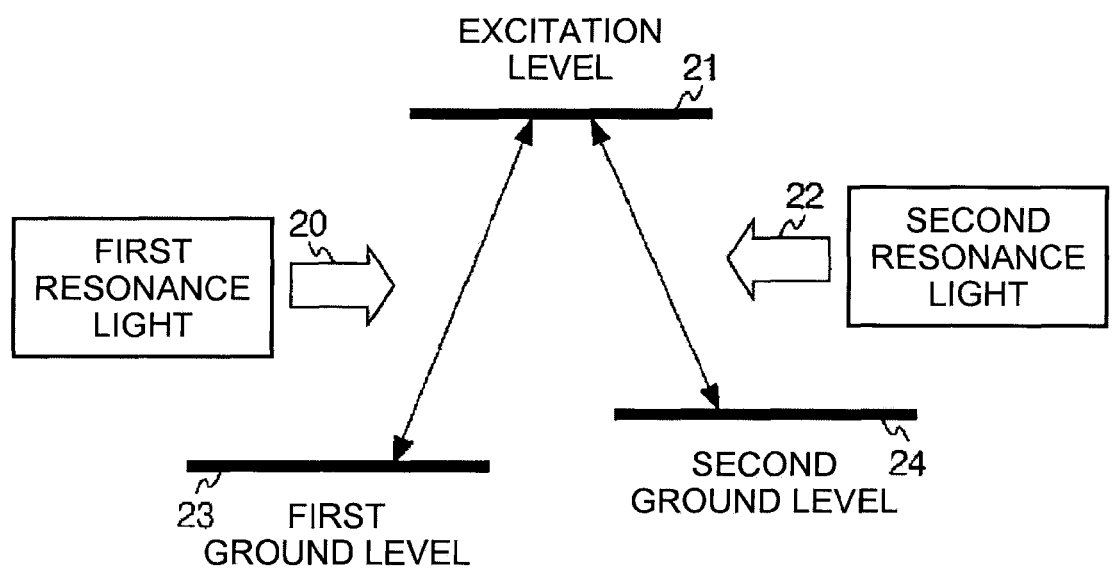
FIG. 1 is a diagram illustrating a three-level system of an atom according to a CPT method.
Figure 6:
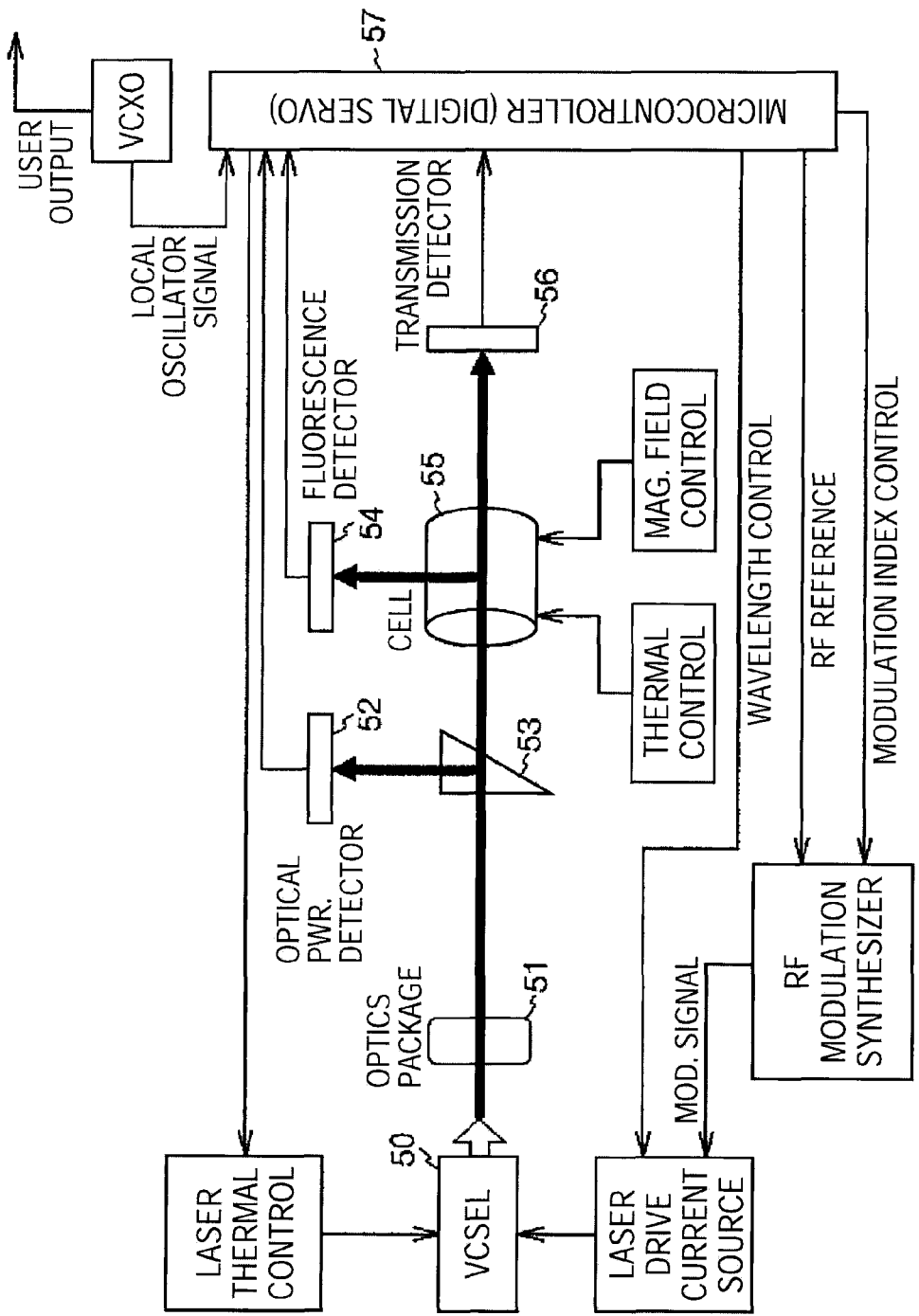
FIG. 6 is a block diagram showing an optical system having a related art structure.

FIG. 1 is a diagram illustrating a three-level system of an atom according to a coherent population trapping (CPT) method. A ground level of rubidium and cesium used in an atomic oscillator is separated into two kinds of ground levels, that is, an ultrafine structure is produced by an interaction between a nuclear spin and an electron spin. Atoms at these ground levels absorb light so as to be excited to have higher energy levels. Here, such a state that two ground levels receive light to be resonance-coupled with a common exiting level as shown in FIG. 1 is called a two-photon resonance. Referring to FIG. 1, energy of a first ground level 23 and energy of a second ground level 24 are slightly different from each other, so that first resonance light 20 and second resonance light 22 are slightly different from each other as well. When a frequency difference (wavelength difference) between the first resonance light 20 and the second resonance light 22 that are simultaneously radiated precisely matches an energy difference between the first ground level 23 and the second ground level 24, the three-level system can be expressed by the coherent state between the first ground level 23 and the second ground level 24. That is, excitation to an excitation level 21 is stopped. The CPT method uses this principle so as to detect and use a state in which light absorption (that is, conversion to the excitation level 21) is stopped in a gas cell 2 when one of or both of wavelengths of the first resonance light 20 and the second resonance light 22 are varied. However, due to light absorbed by the gas cell 2, metal atoms within the gas cell 2 emits fluorescence 5 until light absorption of the gas cell 2 is stopped.

First Embodiment

FIG. 2A is a diagram schematically showing a structure of an optical system according to a first embodiment of the invention. FIG. 2B is a diagram showing a structure in which a polarizer is closely attached to a gas cell. This optical system 60 is included in an atomic oscillator that regulates an oscillation frequency by using an optical absorption property by a double resonance method utilizing light and micro waves or a CPT method utilizing quantum interference effect produced by two kinds of resonance light. The optical system 60 includes: a light source 1 emitting resonance light 6; a polarizer 12 polarizing the resonance light 6 in a predetermined vibrating direction; the gas cell 2 disposed at an emitting side of the light source 1, sealing a gaseous metal atom therein and transmitting the resonance light 6 through a metal atom gas; a light detector 4 serving as a light detecting unit detecting transmitted light 7 that is transmitted through the gas cell 2; and a polarizer 3 disposed at the emitting side of the gas cell 2 and serving as a polarizing unit blocking the fluorescence 5 emitted from the gas cell 2. The polarizer 3 may be disposed so as to be closely attached to an emitting surface of the gas cell 2 as shown in FIG. 2B. Alternatively, the polarizer 3 may be disposed on an inner wall of the emitting surface of the gas cell 2. In another case, a surface, which faces the light detector 4, of the gas cell 2 may be made of polarizing glass so as to block the fluorescence 5. In this case, the polarizing glass has a polarizing direction same as that of the transmitted light 7. The whole of the gas cell 2 may be made of polarizing glass.

When the light source 1 has a wavelength at which light is absorbed by the gas cell 2, the metal atom in the gas cell 2 emits the fluorescence 5 due to the light absorbed by the gas cell 2. The fluorescence 5 has no specific polarizing direction (the fluorescence 5 has various polarizing directions) and is made incident on the light detector 4 as leaked light so as to increase a level of primary transmitted light, resulting in degradation of an S/N ratio of a detecting signal. Therefore, in the first embodiment, the polarizer 3 blocking the fluorescence 5 emitted from the gas cell 2 is disposed at the emitting side of the gas cell 2. Accordingly, the S/N ratio of a signal for detecting the transmitted light 7 can be improved. Here, the resonance light 6 emitted from the light source 1 is linearly polarized light having a predetermined polarizing direction. The resonance light 6 is transmitted through the polarizer 12 to be incident on the gas cell 2. Therefore, when the polarizing unit is composed of the polarizer 3 having the same polarizing direction as that of the transmitted light, only the transmitted light 7 is transmitted through the polarizer 3 and the fluorescence 5 is hardly transmitted through the same. Thus, the transmitted light 7 is selectively transmitted. Here, the polarizer 12 may be attached on an incident surface of the gas cell 2 or a surface of the light source 1. Further, in the first embodiment, the resonance light 6 emitted from the light source 1 may be circularly polarized light. The polarizing direction of the polarizer 12 and that of the polarizer 3 are set to match in this case as well.

Second Embodiment

FIG. 3A is a diagram schematically showing a structure of an optical system according to a second embodiment of the invention. FIG. 3B is a diagram showing a structure in which a blocking plate is closely attached to a gas cell. Elements same as those in FIGS. 2A and 2B are given the same reference numbers and explained. This optical system 61 is included in an atomic oscillator that regulates an oscillation frequency by using an optical absorption property by a double resonance method utilizing light and micro waves or a CPT method utilizing quantum interference effect produced by two kinds of resonance light. The optical system 61 includes: the light source 1 emitting the resonance light 6; the gas cell 2 disposed at the emitting side of the light source 1, sealing a gaseous metal atom therein and transmitting the resonance light 6 through a metal atom gas; the light detector 4 serving as a light detecting unit detecting the transmitted light 7 that is transmitted through the gas cell 2; and a blocking plate 8 disposed at the emitting side of the gas cell 2 and blocking the fluorescence 5 emitted from the gas cell 2. The blocking plate 8 may be disposed so as to be closely attached to the emitting surface of the gas cell 2 as shown in FIG. 3B. Alternatively, a surface, which faces the light detector 4, of the gas cell 2 may be composed of the blocking plate, and a portion serving as a pin hole 9 of the blocking plate may be made of a transparent member made of glass, for example. Thereby, the optical system can be miniaturized. In another case, an optical fiber is disposed between the light detector 4 and the gas cell 2 so as to introduce the transmitted light 7 to a light receiving surface of the light detector 4. In this case, the light receiving surface of the light detector 4 may be set to face in any direction. Referring to FIG. 3, the light receiving surface of the light detector 4 is set to face the right side of the drawing, for example. Accordingly, the optical fiber functions as the fluorescence blocking unit, thereby being able to be used as the blocking plate 8.

The fluorescence 5 emitted from the gas cell 2 diffuses all around at random. Especially, fluorescence 5a diffusing from the emitting surface of the gas cell 2 highly possibly enters the light detector 4. Therefore, in the second embodiment, the optical system 61 has a structure in which the blocking plate 8 having a pin hole 9 as an opening which is necessary for the transmitted light 7 to pass therethrough is provided, and thus the fluorescence 5 other than the transmitted light 7 is blocked. Accordingly, only the transmitted light 7 is transmitted through while blocking the fluorescence 5 as leaked light by a simple structure.

Third Embodiment

FIG. 4A is a diagram schematically showing a structure of an optical system according to a third embodiment of the invention. FIG. 4B is a diagram showing a structure in which a blocking plate and a polarizer are closely attached to a gas cell. Elements same as those in FIGS. 2A and 2B are given the same reference numbers and explained. This optical system 62 is included in an atomic oscillator that regulates an oscillation frequency by using an optical absorption property by a double resonance method utilizing light and micro waves or a CPT method utilizing quantum interference effect produced by two kinds of resonance light. The optical system 62 includes: the light source 1 emitting the resonance light 6; the polarizer 12 polarizing the resonance light 6 in a predetermined vibrating direction; the gas cell 2 disposed at the emitting side of the light source 1, sealing a gaseous metal atom therein and transmitting the resonance light 6 through a metal atom gas; the light detector 4 serving as a light detecting unit detecting the transmitted light 7 that is transmitted through the gas cell 2; the blocking plate 8 blocking the fluorescence 5 emitted from the gas cell 2 and disposed at the emitting side of the gas cell 2; and the polarizer 3 also blocking the fluorescence 5 and disposed at the emitting side of the gas cell 2. The blocking plate 8 and the polarizer 3 may be disposed so as to be closely attached to the emitting surface of the gas cell 2 as shown in FIG. 4B. Here, though the blocking plate 8 and the polarizer 3 are disposed in this order from the gas cell 2 in the third embodiment, they may be disposed in an inversed order.

Even though the fluorescence is polarized by the polarizer 3, a slight amount of fluorescence may not be blocked by the polarizer 3. Therefore, the polarizer 3 and the blocking plate 8 are disposed in series so as to form a fluorescence blocking unit. Accordingly, the fluorescence as the leaked light can be more effectively blocked. As the distance from the gas cell 2 to the light detector 4 is increased, surrounding leaked light is more highly likely incident on the light detector 4. Therefore, as shown in FIG. 4B, the fluorescence blocking unit is disposed to be closely attached to the emitting surface of the gas cell 2. Accordingly, provability that the surrounding leaked light enters the light detector 4 can be lowered and the optical system can be miniaturized.

Fourth Embodiment

FIG. 5A is a diagram for explaining a method for preventing diffusion of fluorescence emitted from a gas cell used in the optical system of the invention. FIG. 5B is a diagram showing the gas cell viewed from the emitting side. This fluorescence absorbing member 63 is provided with a reflection preventing tube 10 serving as a fluorescence absorbing member absorbing the fluorescence 5 at the circumference of the gas cell 2, and has through holes 11, for light pass, disposed at an incident surface and an emitting surface of the tube 10. The fluorescence absorbing member is formed: (I) by applying a black coating material or a deep color coating material on an inner surface of a case in which the gas cell 2 is housed; (II) by forming the case in which the gas cell 2 is housed by a black resin material; or (III) by conducting a blackening surface treatment such as an alumite treatment on the case in which the gas cell 2 is housed.

The circumference of the gas cell 2 is made of transparent glass, so that the fluorescence 5 may be emitted from all surfaces of the gas cell 2. In addition, if there is a reflection member at the periphery of the gas cell 2, the fluorescence 5 may be reflected so as to be disadvantageously incident on the light detector 4 as wandering light. Therefore, in a fourth embodiment, the fluorescence absorbing member is provided on the circumference of the gas cell 2. Accordingly, the fluorescence emitted from the gas cell 2 can be prevented from entering the light detector 4 as wandering light.

Further, the polarizing unit may be composed of a polarizing filter or a beam splitter. The polarizing filter serves as a filter by which light in a vibrating direction is taken out, and the beam splitter reflects a part of incident light and transmits other part of the light therethrough. Therefore, a polarizing beam splitter that is capable of separating polarization components may be used. Thereby, the transmitted light 7 and the fluorescence 5 can be securely separated from each other with a simple structure.

Further, an atomic oscillator including the above optical system detects an intensity of fluorescence, feeds back the intensity to a coherent light source, and thus detects overall variation of light emitted from the coherent light source in real time, being able to stabilize light intensity of the coherent light source. Thus, a high-performance atomic oscillator of which the S/N ratio is improved can be provided.

What is claimed is:

1. An optical system of an atomic oscillator that regulates an oscillation frequency by using an optical absorption property by one of a double resonance method utilizing light and micro waves and a coherent population trapping (CPT) method utilizing a quantum interference effect produced by two kinds of resonance light, comprising:
   a light source emitting the resonance light;
   a gas cell, sealing a gaseous metal atom therein and transmitting the resonance light through a metal atom gas;
   a light detecting unit detecting the transmitted light that is transmitted through the metal atom gas; and
   a fluorescence blocking unit blocking at least a part of fluorescence, the fluorescence being emitted from the metal atom gas to the light detecting unit, and disposed between the metal atom gas and the light detecting unit.

2. The optical system of an atomic oscillator according to claim 1, wherein the fluorescence blocking unit is composed of a polarizing unit that selectively transmits the transmitted light.

3. The optical system of an atomic oscillator according to claim 1, wherein the fluorescence blocking unit is composed of a blocking plate having an opening through which the transmitted light is able to pass.

4. The optical system of an atomic oscillator according to claim 1, wherein the fluorescence blocking unit is composed of the polarizing unit and the blocking plate.

5. The optical system of an atomic oscillator according to claim 1, wherein the fluorescence blocking unit is closely attached to the gas cell.

6. The optical system of an atomic oscillator according to claim 1, wherein a fluorescence absorbing member absorbing the fluorescence is formed at a circumference of the gas cell.

7. The optical system of an atomic oscillator according to claim 1, wherein the polarizing unit is composed of one of a polarizing filter and a beam splitter.

8. The optical system of an atomic oscillator according to claim 1, wherein the gas cell is made of polarizing glass and the polarizing glass serves also as the fluorescence blocking unit.

9. An atomic oscillator comprising the optical system according to claim 1.

\* \* \* \* \*